United States Patent
Wada et al.

(10) Patent No.: US 12,305,113 B2
(45) Date of Patent: May 20, 2025

(54) HEAT-CONDUCTIVE RESIN COMPOSITION AND HEAT DISSIPATION SHEET

(71) Applicant: DENKA COMPANY LIMITED, Tokyo (JP)

(72) Inventors: Kosuke Wada, Tokyo (JP); Kiyotaka Fuji, Tokyo (JP); Yoshitaka Taniguchi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 186 days.

(21) Appl. No.: 18/008,631

(22) PCT Filed: Jun. 11, 2021

(86) PCT No.: PCT/JP2021/022360
§ 371 (c)(1),
(2) Date: Dec. 6, 2022

(87) PCT Pub. No.: WO2021/251494
PCT Pub. Date: Dec. 16, 2021

(65) Prior Publication Data
US 2023/0220263 A1    Jul. 13, 2023

(30) Foreign Application Priority Data
Jun. 12, 2020    (JP) .................. 2020-102302

(51) Int. Cl.
*C09K 5/14*    (2006.01)
*C08J 5/18*    (2006.01)
(Continued)

(52) U.S. Cl.
CPC .................. *C09K 5/14* (2013.01); *C08J 5/18* (2013.01); *C08K 3/38* (2013.01); *C08K 7/00* (2013.01);
(Continued)

(58) Field of Classification Search
CPC ..... C09K 5/14; C08K 3/38; C08K 7/00; C08J 5/18; H05K 7/2039
(Continued)

(56) References Cited

U.S. PATENT DOCUMENTS

| 10,308,856 B1 | 6/2019 | Wang et al. |
| 2016/0115343 A1 | 4/2016 | Takahara et al. |

(Continued)

FOREIGN PATENT DOCUMENTS

| CN | 108495897 A | 9/2018 |
| CN | 109790025 A | 5/2019 |

(Continued)

OTHER PUBLICATIONS

Machine_English_translation_JP_2019073409_A; Kurokawa, et. al. Method for Producing Bulk Boron Nitride Powder and Heat Radation Member Using the same; May 16, 2019; EPO; whole document (Year: 2024).*

(Continued)

*Primary Examiner* — Tahseen Khan
(74) *Attorney, Agent, or Firm* — Oliff PLC

(57) ABSTRACT

A heat-conductive resin composition containing an inorganic filler component and a resin component, wherein the inorganic filler component includes first and second inorganic fillers, a particle size distribution has a first maximum point caused by the first inorganic filler and a second maximum point caused by the second, the diameter at the first maximum point is 15 μm or more, the diameter at the second is ⅔ or less that at the first, an integrated amount of frequency between a peak start and end in a peak having the first maximum point is 50% or more, and the first inorganic filler is formed by agglomerating hexagonal boron nitride primary particles and has a crushing strength of 6 MPa or (Continued)

more. The heat dissipation sheet is obtained by molding the heat-conductive resin composition.

7 Claims, 1 Drawing Sheet

(51) Int. Cl.
  *C08K 3/38* (2006.01)
  *C08K 7/00* (2006.01)
  *H05K 7/20* (2006.01)
(52) U.S. Cl.
  CPC ........ *H05K 7/2039* (2013.01); *C08J 2383/07* (2013.01); *C08K 2003/385* (2013.01); *C08K 2201/001* (2013.01); *C08K 2201/005* (2013.01)
(58) Field of Classification Search
  USPC ....................................................... 428/220
  See application file for complete search history.

(56) References Cited

U.S. PATENT DOCUMENTS

| 2020/0040245 | A1 | 2/2020 | Takeda et al. |
| 2020/0247672 | A1 | 8/2020 | Takeda et al. |
| 2020/0277189 | A1 | 9/2020 | Thendie et al. |
| 2021/0163708 | A1 | 6/2021 | Mukai et al. |
| 2022/0154060 | A1 | 5/2022 | Takeda et al. |

FOREIGN PATENT DOCUMENTS

| CN | 111212811 A | 5/2020 | |
| EP | 3 647 265 A1 | 5/2020 | |
| EP | 3761355 A1 * | 1/2021 | ............ C08G 77/04 |
| JP | H09-202663 A | 8/1997 | |
| JP | 2007-502770 A | 2/2007 | |
| JP | 2009-286809 A | 12/2009 | |
| JP | 2011-098882 A | 5/2011 | |
| JP | 2014-040341 A | 3/2014 | |
| JP | 2014-210857 A | 11/2014 | |
| JP | 2015-193504 A | 11/2015 | |
| JP | 2017-092322 A | 5/2017 | |
| JP | 2019073409 A * | 5/2019 | |
| JP | 2019-164002 A | 9/2019 | |
| WO | 2014/199650 A1 | 12/2014 | |
| WO | 2017/135237 A1 | 8/2017 | |
| WO | 2018/066277 A1 | 4/2018 | |
| WO | 2018/123788 A1 | 7/2018 | |
| WO | 2019/073690 A1 | 4/2019 | |
| WO | WO-2019164002 A1 * | 8/2019 | ............ C08G 77/04 |
| WO | 2020/049817 A1 | 3/2020 | |

OTHER PUBLICATIONS

Aug. 17, 2021 International Search Report issued in International Patent Application No. PCT/JP2021/022360.
Feb. 21, 2023 Office Action issued in Chinese Patent Application No. 202180041089.4.

* cited by examiner

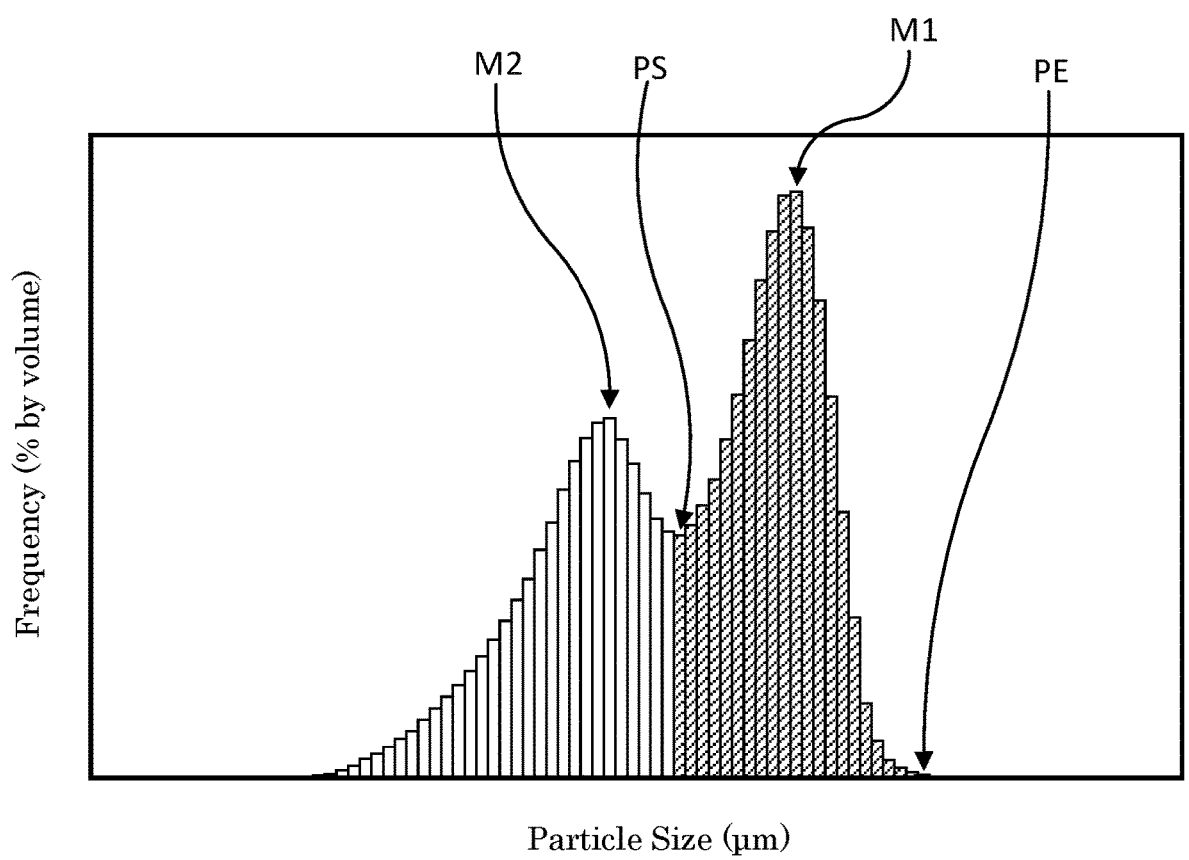

HEAT-CONDUCTIVE RESIN COMPOSITION AND HEAT DISSIPATION SHEET

TECHNICAL FIELD

The present invention relates to a heat-conductive resin composition containing boron nitride particles and a heat dissipation sheet obtained by molding the heat-conductive resin composition.

BACKGROUND ART

In heat-generating electronic components such as a power device, a transistor, a thyristor, and a CPU, how to efficiently dissipate heat generated during use is an important problem. Conventionally, as such heat dissipation measures, it has been generally performed that (1) an insulating layer of a printed wiring board on which a heat-generating electronic component is mounted is made to have high thermal conductivity, and (2) a heat-generating electronic component or a printed wiring board on which a heat-generating electronic component is mounted is attached to a heat sink via an electrically insulating thermal interface material. A silicone resin or an epoxy resin filled with ceramic powder has been used as an insulating layer of a printed wiring board and a thermal interface material.

In recent years, the heat generation density in electronic devices has been increasing year by year with the increase in the speed and integration of circuits in heat-generating electronic components and the increase in the mounting density of heat-generating electronic components on printed wiring boards. Therefore, there is a demand for a ceramic powder having a higher thermal conductivity than ever before.

Under the circumstances described above, attention has been paid to hexagonal boron nitride powder having excellent properties as an electrical insulating material such as high thermal conductivity, high insulating property, and low relative dielectric constant.

However, while the thermal conductivity of the hexagonal boron nitride particles in the in-plane direction (a-axis direction) is 400 W/(m·K), the thermal conductivity thereof in the thickness direction (c-axis direction) is 2 W/(m·K), and the anisotropy of thermal conductivity derived from the crystal structure and the scale-like shape is large. Further, when the hexagonal boron nitride powder is filled in the resin, the particles are aligned and oriented in the same direction. Then, the thickness directions (c-axis directions) of the hexagonal boron nitride particles in the resin are aligned.

Therefore, for example, at the time of producing the thermal interface material, the in-plane direction (a-axis direction) of the hexagonal boron nitride particles and the thickness direction of the thermal interface material become perpendicular to each other, and the high thermal conductivity in the in-plane direction (a-axis direction) of the hexagonal boron nitride particles cannot be sufficiently utilized.

PTL 1 proposes the use of a boron nitride powder in which hexagonal boron nitride particles as primary particles are agglomerated without being oriented in the same direction. When the boron nitride powder is filled in a resin, hexagonal boron nitride particles as primary particles are not oriented in the same direction, and anisotropy of thermal conductivity can be suppressed. As boron nitride powdered in which hexagonal boron nitride particles as primary particles are agglomerated without being oriented in the same direction, spherical boron nitride produced by a spray drying method (PTL 2), agglomerated boron nitride produced using boron carbide as a raw material (PTL 3), agglomerated boron nitride produced by repeating pressing and crushing (PTL 4), and the like are known in addition to those described in PTL 1.

CITATION LIST

Patent Literature

PTL 1: JP 9-202663 A
PTL 2: JP 2014-40341 A
PTL 3: JP 2011-98882 A
PTL 4: JP 2007-502770 T

SUMMARY OF INVENTION

Technical Problem

In recent years, with miniaturization of heat-generating electronic components, a thin heat dissipation sheet has been required. A doctor blade method is known as a method for continuously obtaining a thin molded body composed of a ceramic raw material powder and an organic component. The doctor blade method is a method of thinly spreading a uniform slurry on a carrier film to obtain a molded body. The doctor blade method is widely used for ceramic substrates for electronic devices, ceramic packages for ICs, multilayer ceramic packages, multilayer ceramic circuit boards, ceramic capacitors, and the like. From the viewpoint of mass production of a thin heat dissipation sheet, it is desirable that the thin heat dissipation sheet is also produced by the doctor blade method. However, it is difficult to produce a thin heat dissipation sheet while maintaining thermal conductivity at a high level.

When a slurry is prepared using a conventional agglomerated boron nitride, the viscosity of the slurry becomes high, so that it has been difficult to obtain a thin molded body by a doctor blade method using a conventional agglomerated boron nitride. In addition, when a thin molded body is produced by a doctor blade method using a conventional agglomerated boron nitride, and a carrier film is peeled off from the thin molded body, there arises a problem that boron nitride particles adhere to the peeled carrier film.

Accordingly, an object of the present invention is to provide a heat-conductive resin composition having excellent thermal conductivity suitable for producing a thin molded body and a heat dissipation sheet obtained by molding the heat-conductive resin composition.

Solution to Problem

As a result of intensive studies to achieve the above object, the present inventors have found that when a slurry is prepared using a conventional agglomerated boron nitride, boron nitride particles are peeled off from the agglomerated boron nitride during the preparation of the slurry, and the peeled boron nitride particles increase the viscosity of the slurry or adhere to the carrier film.

The present invention is based on the above-mentioned findings and is summarized as follows.

[1] A heat-conductive resin composition containing an inorganic filler component and a resin component, wherein the inorganic filler component includes a first inorganic filler and a second inorganic filler, a particle size distribution of the inorganic filler component has a first maximum point caused by the first inorganic filler and a second maximum point caused by the second inorganic filler, a particle diameter at the first maximum point is 15 μm or more, a particle diameter at the second maximum point is ⅔ or less of the particle diameter at the first maximum point, an integrated amount of frequency between a peak start and a peak end in a peak having the first maximum point is 50% or more, and the first inorganic filler is formed by agglomerating hexagonal boron nitride primary particles and has a crushing strength of 6 MPa or more.

[2] The heat-conductive resin composition as set forth in [1], wherein the second inorganic filler is boron nitride particles.

[3] The heat-conductive resin composition as set forth in [2], wherein the second inorganic filler is massive boron nitride particles formed by agglomerating hexagonal boron nitride primary particles and having a crushing strength of 6 MPa or more.

[4] The heat-conductive resin composition as set forth in any one of [1] to [3], wherein in particle size accumulation of the inorganic filler component, an integrated amount of the frequency of particle diameters of 0 to 15 μm is less than 60%.

[5] A heat dissipation sheet obtained by molding the heat-conductive resin composition as set forth in any one of [1] to [4].

[6] The heat dissipation sheet as set forth in [5], having a thickness of 0.35 mm or less.

[7] The heat dissipation sheet as set forth in [5] or [6], further containing a base material having a thickness of 0.05 mm or less.

Advantageous Effects of Invention

According to the present invention, it is possible to provide a heat-conductive resin composition having excellent thermal conductivity suitable for producing a thin molded body and a heat dissipation sheet formed by molding the heat-conductive resin composition.

BRIEF DESCRIPTION OF DRAWINGS

FIG. 1 is a diagram showing an example of a particle size distribution of an inorganic filler component.

DESCRIPTION OF EMBODIMENTS

[Heat-Conductive Resin Composition]

The heat-conductive resin composition of the present invention is obtained by blending an inorganic filler component and a resin component.

(Inorganic Filler Component)

The inorganic filler component includes a first inorganic filler and a second inorganic filler. The particle size distribution of the inorganic filler component has a first maximum point caused by the first inorganic filler and a second maximum point caused by the second inorganic filler, the particle diameter at the first maximum point is 15 μm or more, the particle diameter at the second maximum point is ⅔ or less of the particle diameter at the first maximum point, and the integrated amount of the frequency between the peak start and the peak end in the peak having the first maximum point is 50% or more. The particle size distribution of the inorganic filler component in the heat-conductive resin composition can be measured, for example, as follows. Components other than the inorganic filler component in the heat-conductive resin composition are dissolved out using solvents such as toluene, xylene, and chlorine-based hydrocarbons to remove the components other than the inorganic filler component from the heat-conductive composition. Then, the particle size distribution of the remaining inorganic filler component is measured using a laser diffraction scattering method particle size distribution measuring apparatus (LS-13 320) manufactured by Beckman Coulter, Inc. When three or more peaks are present, the peak having the highest frequency of maximum points is regarded as the peak having the maximum point caused by the first inorganic filler, and the peak having the second highest frequency of maximum points is regarded as the peak having the maximum point caused by the second inorganic filler. The unit of frequency in the particle size distribution is % by volume.

<First Inorganic Filler>

The first inorganic filler is massive boron nitride particles formed by agglomeration of hexagonal boron nitride primary particles and having a crushing strength of 6 MPa or more. If the crushing strength of the massive boron nitride particles is less than 6 MPa, when the heat-conductive resin composition is made into a slurry state, some of the massive boron nitride particles are peeled off from the massive boron nitride particles and the viscosity of the heat-conductive resin composition increases. As a result, a thin molded body cannot be produced by the doctor blade method, or some of the massive boron nitride particles adhere to the carrier film. From such a viewpoint, the crushing strength of the massive boron nitride particles is preferably 7 MPa or more, more preferably 8 MPa or more, still more preferably 9 MPa or more, even more preferably 10 MPa or more, and particularly preferably 11 MPa or more. The upper limit value of the crushing strength of the massive boron nitride particles is not particularly limited, but is, for example, 30 MPa or less.

The crushing strength of the first inorganic filler can be measured in accordance with JIS R1639-5. Specifically, the crushing strength of the first inorganic filler can be measured in the following manner. Components other than the inorganic filler component in the heat-conductive resin composition are dissolved out using solvents such as toluene, xylene, and chlorine-based hydrocarbons to remove the components other than the inorganic filler component from the heat-conductive resin composition. Then, the particle size distribution of the remaining inorganic filler component is measured using a laser diffraction scattering method particle size distribution measuring apparatus (LS-13 320) manufactured by Beckman Coulter, Inc. Next, after the inorganic filler component is sprayed on a sample table of a micro compression tester ("MCT-W500" manufactured by Shimadzu Corporation), the diameters of the inorganic filler component in the X direction and the Y direction are measured, and the average of the diameters is defined as the particle diameter of the inorganic filler component. Five inorganic filler components having a particle diameter within the range of the particle diameter at the first maximum point ±5 μm are selected and subjected to a compression test one by one. The crushing strength ($\sigma$: MPa) is calculated from the dimensionless number (a=2.48) which varies depending on the position in the particle, the crushing test force (P: N), and the particle diameter (d: μm) using the equation $\sigma = a \times P/(\Pi \times d^2)$. The crushing strengths of the five inorganic filler components are Weibull plotted in accordance with JIS R1625, and the crushing strength at which the cumulative fracture rate is 63.2% is defined as the crushing strength of the first inorganic filler.

The particle diameter at the first maximum point caused by the first inorganic filler is 15 μm or more. When the particle diameter at the first maximum point caused by the first inorganic filler is less than 15 µm, the heat-conductive resin composition cannot contain the first inorganic filler at a high filling rate, and the thermal conductivity of the heat dissipation sheet produced using the heat-conductive resin composition may be low. From such a viewpoint, the particle diameter at the first maximum point is preferably 20 µm or more, more preferably 30 µm or more, still more preferably 40 µm or more, and particularly preferably 50 µm or more. Also, the particle diameter at the first maximum point is preferably 100 µm or less. When the particle diameter at the first maximum point is 100 µm or less, a thin heat dissipation sheet can be produced using the heat-conductive resin composition. From such a viewpoint, the particle diameter at the first maximum point is more preferably 90 µm or less, and still more preferably 80 µm or less. The particle diameter at the first maximum point can be adjusted, for example, by adjusting the average particle diameter of the first inorganic filler with the particle diameter of the $B_4C$ that is the raw material of the massive boron nitride particles. That is, when the particle diameter of the $B_4C$ which is the raw material of the massive boron nitride particles is increased, the particle diameter at the first maximum point is increased, and when the particle diameter of the $B_4C$ is decreased, the particle diameter at the first maximum point is decreased. The fact that the particle diameter at the first maximum point is caused by the first inorganic filler means that the maximum point of the particle size distribution of the first inorganic filler appears as the first maximum point in the particle size distribution of the inorganic filler component. In addition, due to the influence of the particle size distribution of the inorganic filler component other than the first inorganic filler, the particle diameter at the first maximum point may be slightly different from the particle diameter at the maximum point of the particle size distribution of the first inorganic filler.

The integrated amount of the frequency between the peak start and the peak end in the peak having the first maximum point is 50% or more. When the integrated amount is less than 50%, the viscosity of the heat-conductive resin composition may increase due to the inorganic filler other than the first inorganic filler, and a thin molded body cannot be produced by the doctor blade method, or the inorganic filler other than the first inorganic filler may adhere to the carrier film. From such a viewpoint, the integrated amount is preferably 60% or more, and more preferably 70% or more. In addition, the integrated amount is preferably 90% or less, and more preferably 80% or less in order that the effect of the inorganic filler component containing the second inorganic filler described below can be exhibited. In particular, by combining the large first inorganic filler having high strength and the second inorganic filler described below, it is possible to improve the productivity and to obtain a heat dissipation sheet in which the inorganic fillers are densely packed. The integrated amount of the frequency between the peak start and the peak end in the peak having the first maximum point is generally the content (% by volume) of the first inorganic filler in the inorganic filler component. Therefore, by analyzing the composition of the inorganic filler component, the inorganic filler corresponding to the first maximum point can be identified.

With reference to FIG. 1, the integrated amount of the frequency between the peak start and the peak end in the peak having the first maximum point will be described. FIG. 1 is a diagram showing an example of a particle size distribution of an inorganic filler component. The horizontal axis is logarithmic. Symbol M1 indicates a first maximum point, and symbol M2 indicates a second maximum point. Also, PS indicates a peak start, and PE indicates a peak end. As shown in FIG. 1, when the tails of adjacent peaks overlap each other, the position of the valley of the peak should be the peak start (PS). Then, the integrated amount of the hatched portion of the peak having the first maximum point (M1) is the integrated amount of the frequency between the peak start (PS) and the peak end (PE) in the peak having the first maximum point (M1). When the tails of adjacent peaks overlap each other on the peak end side, the position of the valley of the peak should be the peak end.

Massive boron nitride particles, which are formed by agglomeration of hexagonal boron nitride primary particles and which have a crushing strength of 6 MPa or more, can be produced by, for example, synthesizing boron carbide using boron and acetylene black as raw materials, and subjecting the obtained boron carbide to (1) a pressure nitriding and firing step and (2) a decarburization crystallization step. Hereinafter, each step will be described in detail.

(1) Pressure Nitriding and Firing Step

In the pressure nitriding and firing step, boron carbide having an average particle diameter of 6 to 55 µm and a carbon content of 18 to 21% is subjected to pressure nitriding and firing. This makes it possible to obtain boron carbonitride suitable as a raw material for the massive boron nitride particles of the present invention.

(i) Boron Carbide as a Raw Material Used in the Pressure Nitriding Step

Since the particle diameter of the boron carbide as the raw material used in the pressure nitriding step strongly affects the finally produced massive boron nitride particles, it is necessary to select boron carbide having an appropriate particle diameter, and it is desirable to use boron carbide having an average particle diameter of 6 to 55 µm as the raw material. At this time, it is desirable that boric acid and free carbon as impurities are small.

The average particle diameter of boron carbide as the raw material is preferably 6 µm or more, more preferably 7 µm or more, and still more preferably 10 µm or more, and is preferably 55 µm or less, more preferably 50 µm or less, and still more preferably 45 µm or less. The average particle diameter of boron carbide as the raw material is preferably 7 to 50 µm, and more preferably 10 to 45 sm. The average particle diameter of boron carbide can be measured using a laser diffraction scattering method particle size distribution measuring apparatus (LS-13 320) manufactured by Beckman Coulter, Inc.

The carbon content of boron carbide as the raw material used in the pressure nitriding step is desirably lower than the compositional $B_4C$ (21.7%), and boron carbide having a carbon content of 18 to 21% is desirably used. The carbon content of boron carbide is preferably 18% or more, and more preferably 19% or more, and is preferably 21% or less, and more preferably 20.5% or less. Also, the carbon amount of boron carbide is preferably 18 to 20.5%, and more preferably 19 to 20.5%. The reason why the carbon amount of boron carbide is set in such a range is that the smaller the amount of carbon generated in the decarburization crystallization step described later is, the more dense massive boron nitride particles are produced, and also the lower the amount of carbon in the finally produced massive boron nitride particles is. In addition, it is difficult to produce stable boron carbide having a carbon amount of less than 18% because the deviation from the theoretical composition becomes too large.

In a method for producing boron carbide as the raw material, boron carbide mass can be obtained by mixing boric acid and acetylene black and then heating the mixture in an atmosphere at 1800 to 2400° C. for 1 to 10 hours. This raw mass is pulverized and then subjected to sieving, washing, impurity removal, drying, and the like as appropriate, whereby a boron carbide powder can be produced. The mixing of boric acid and acetylene black, which are raw materials of boron carbide, is preferably 25 to 40 parts by mass of acetylene black with respect to 100 parts by mass of boric acid.

The atmosphere at the time of producing boron carbide is preferably an inert gas, and examples of the inert gas include argon gas and nitrogen gas, and these gases can be appropriately used alone or in combination. Among them, argon gas is preferable.

For the pulverization of the boron carbide mass, a general pulverizer or crusher can be used, and the pulverization is performed for about 0.5 to 3 hours, for example. The boron carbide after pulverization is preferably sieved to a particle diameter of 75 μm or less using a sieve net. The average particle diameter of the massive boron nitride particles can be adjusted by adjusting the average particle diameter of the boron carbide after pulverization.

(ii) Pressure Nitriding and Firing

The pressure nitriding and firing is performed in an atmosphere under specific firing temperature and pressure conditions.

The firing temperature in the pressure nitriding and firing is preferably 1700° C. or higher, and more preferably 1800° C. or higher, and is preferably 2400° C. or lower, and more preferably 2200° C. or lower. Further, the firing temperature in the pressure nitriding and firing is more preferably 1800 to 2200° C.

The pressure in the pressure nitriding and firing is preferably 0.6 MPa or more, and more preferably 0.7 MPa or more, and is preferably 1.0 MPa or less, and more preferably 0.9 MPa or less. Also, the pressure in the pressure nitriding and firing is preferably 0.6 to 1.0 MPa, and more preferably 0.7 to 0.9 MPa.

As a combination of the firing temperature and the pressure conditions in the pressure nitriding and firing, the firing temperature is preferably 1800° C. or higher and the pressure is preferably 0.7 to 1.0 MPa. When the firing temperature is 1800° C. and the pressure is 0.7 MPa or more, the boron carbide can be sufficiently nitrided. From an industrial point of view, it is desirable to carry out the production at a pressure of 1.0 MPa or less.

As an atmosphere in the pressure nitriding and firing, a gas in which a nitriding reaction can proceed is required, and examples thereof include nitrogen gas and ammonia gas, and these may be used alone or in combination of two or more. Among them, nitrogen gas is preferable for nitriding and in terms of cost. The concentration of nitrogen gas in the atmosphere is preferably 95% (V/V) or more, and more preferably 99.9% (V/V) or more.

The firing time in the pressure nitriding and firing is preferably 6 to 30 hours, and more preferably 8 to 20 hours.

(2) Decarburization Crystallization Step

In the decarburization crystallization step, the boron carbonitride obtained in the pressure nitriding step is subjected to a heat treatment (a) in an atmosphere of normal pressure or higher, (b) at a specific raising temperature, (c) performing temperature raising until the temperature reaches a firing temperature in a specific temperature range, and (d) holding at the firing temperature for a certain period of time. As a result, it is possible to obtain massive boron nitride particles in which primary particles (hexagonal boron nitride whose primary particles are scaly) are agglomerated into a mass. In particular, if the conditions of the heat treatment are in a range described later, the crushing strength can be 6 MPa or more.

In the decarburization crystallization step, the boron carbonitride obtained from the boron carbide prepared as described above is decarbonized and agglomerated into a scaly shape having a predetermined size to form massive boron nitride particles.

To be more specific, in the decarburization crystallization step, 100 parts by mass of the boron carbonitride obtained in the pressure nitriding and firing step and 65 to 130 parts by mass of at least one compound of boron oxide and boric acid are mixed to prepare a mixture, and the obtained mixture is subjected to a heat treatment in which the mixture is heated to a temperature at which decarburization can be started, then heated to a firing temperature of 1950 to 2100° C. at a temperature raising rate of 5° C./min or less, and held at the firing temperature for more than 0.5 hours and less than 20 hours. By performing such a heat treatment, the crushing strength can be made 6 MPa or more.

As the decarburization crystallization step, a heat treatment is preferably performed in which the temperature is raised to a temperature at which decarburization can be started in an atmosphere of normal pressure or higher, the temperature is then raised to a firing temperature of 1950 to 2100° C. at a temperature raising rate of 5° C./min or less, and the firing temperature is held for more than 0.5 hours and less than 20 hours. Further, as the decarburization crystallization step, it is more preferable to perform a heat treatment in which the temperature is raised to a temperature at which decarburization can be started in an atmosphere of normal pressure or higher, the temperature is then raised to a firing temperature of 2000 to 2080° C. at a temperature raising rate of 5° C./min or less, and the firing temperature is held for 2 to 8 hours.

In the decarburization crystallization step, it is desirable to mix the boron carbonitride obtained in the pressure nitriding and firing step with at least one compound of boron oxide and boric acid (and other raw materials as necessary) to prepare a mixture, and then decarburization crystallize the obtained mixture. From the viewpoint of making the crushing strength of the massive boron nitride particles 6 MPa or more, the mixing proportion of the boron carbonitride and the compound of at least one of boron oxide and boric acid is preferably 65 to 130 parts by mass of the compound of at least one of boron oxide and boric acid, and more preferably 70 to 120 parts by mass of the compound of at least one of boron oxide and boric acid, with respect to 100 parts by mass of the boron carbonitride. In the case of boron oxide, the mixing proportion is in terms of boric acid.

The pressure condition of "(a) an atmosphere of normal pressure or higher" in the decarburization crystallization step is preferably normal pressure or higher, and more preferably 0.1 MPa or more. The upper limit value of the pressure condition of the atmosphere is not particularly limited, but is preferably 1 MPa or less, more preferably 0.5 MPa or less, and still more preferably 0.3 MPa or less. Also, the pressure condition of the atmosphere is preferably 0.1 to 1 MPa, more preferably 0.1 to 0.5 MPa, and still more preferably 0.1 to 0.3 MPa.

The "atmosphere" in the decarburization crystallization step is preferably nitrogen gas, and the concentration of nitrogen gas in the atmosphere is preferably 90% (V/V) or more, and more preferably the nitrogen gas is high-purity nitrogen gas (nitrogen concentration: 99.9% (V/V) or more).

The temperature raising of "(b) at a specific raising temperature" in the decarburization crystallization step may be either one stage or multiple stages. In order to shorten the time required for raising the temperature to a temperature at which decarburization can be started, it is desirable to select multiple stages. As the "first stage temperature raising" in multiple stages, it is preferable to perform the temperature raising to a "temperature at which decarburization can be started". The "temperature at which decarbonization can be started" is not particularly limited, and may be a temperature usually used, for example, about 800 to 1200° C. (suitably about 1000° C.). The "first stage temperature raising" can be performed, for example, in a range of 5 to 20° C./min, and is preferably 8 to 12° C./min.

It is preferable to perform the second stage temperature raising after the first stage temperature raising. More preferably, the above-mentioned "second stage temperature raising" is "(c) performing temperature raising until the temperature reaches a firing temperature in a specific temperature range" in the decarburization crystallization step.

The "second stage temperature raising" is preferably 5° C./min or less, more preferably 4° C./min or less, still more preferably 3° C./min or less, and even more preferably 2° C./min or less. When the temperature raising rate in the second stage is 5° C./min or less, grain growth becomes more uniform and the massive boron nitride particles have a uniform structure, so that the crushing strength is further increased. The "second stage temperature raising" is preferably 0.1° C./min or more, more preferably 0.5° C./min or more, and still more preferably 1° C./min or more. When the "second stage temperature raising" is 0.1° C./min or more, the production time can be shortened, and thus the production cost can be reduced. The "second stage temperature raising" is preferably 0.1 to 5° C./min.

The specific temperature range (firing temperature after temperature raising) in the above "(c) performing temperature raising until the temperature reaches a firing temperature in a specific temperature range" is preferably 1950° C. or higher, more preferably 1960° C. or higher, and still more preferably 2000° C. or higher, and is preferably 2100° C. or lower, and more preferably 2080° C. or lower.

The constant time holding (the firing time after temperature raising) in the above "(d) holding at the firing temperature for a certain period of time" is preferably more than 0.5 hours and less than 20 hours. The "firing time" is more preferably 1 hour or more, still more preferably 3 hours or more, even more preferably 5 hours or more, and particularly preferably 10 hours or more, and is more preferably 18 hours or less, and still more preferably 16 hours or less. When the firing time after the temperature raising is more than 0.5 hours, grain growth occurs well, and when the firing time is less than 20 hours, it is possible to reduce a decrease in grain strength due to excessive grain growth and to reduce an industrial disadvantage due to a long firing time.

Then, the massive boron nitride particles of the present invention can be obtained through the pressure nitriding and firing step and the decarburization crystallization step. Further, in the case of loosening the weak agglomeration between the massive boron nitride particles, it is desirable that the massive boron nitride particles obtained in the decarburization crystallization step are pulverized or crushed and further classified. The pulverization and crushing are not particularly limited, and a generally used pulverizer and crusher may be used, and the classification may be performed by a general sieving method such that the average particle diameter is 20 μm or more. For example, there may be mentioned a method in which crushing is carried out with a Henschel mixer or a mortar, and then classification is carried out with a vibration sieve.

<Second Inorganic Filler>

The particle diameter at the second maximum point caused by the second inorganic filler is ⅔ or less of the particle diameter at the first maximum point. When the particle diameter at the second maximum point is larger than ⅔ of the particle diameter at the first maximum point, the heat-conductive resin composition cannot contain the inorganic filler component at a high filling ratio, and a part of the inorganic filler component may adhere to the carrier film or the thermal conductivity of the heat dissipation sheet produced using the heat-conductive resin composition may decrease. From such a viewpoint, the particle diameter at the second maximum point is preferably equal to or less than 60% of the particle diameter at the first maximum point, more preferably equal to or less than 55% of the particle diameter at the first maximum point, and still more preferably equal to or less than 52% of the particle diameter at the first maximum point. The lower limit value of the particle diameter at the second maximum point is, for example, 20% or more of the particle diameter at the first maximum point, and preferably 30% or more or 40% or more. Further, the second maximum point can be measured in the same manner as the first maximum point. There may be a plurality of second maximum points. In addition, the integrated amount of the frequency between the peak start and the peak end in the peak having the second maximum point is generally the content (% by volume) of the second inorganic filler in the inorganic component. Therefore, by analyzing the composition of the inorganic filler component, the inorganic filler corresponding to the second maximum point can be identified.

The integrated amount of the frequency between the peak start and the peak end in the peak having the second maximum point is 50% or less, may be 45% or less, may be 40% or less, or may be 35% or less. The lower limit may be 10% or more, may be 15% or more, may be 20% or more, or may be 25% or more.

Examples of the second inorganic filler include alumina particles, aluminum nitride particles, and boron nitride particles. These second inorganic fillers may be used alone or in combination of two or more. Among these, the second inorganic filler is preferably boron nitride particles. When the second inorganic filler is boron nitride particles, the thermal conductivity of the heat dissipation sheet produced using the heat-conductive resin composition can be further increased. Further, the second inorganic filler is more preferably massive boron nitride particles formed by agglomeration of hexagonal boron nitride primary particles and having a crushing strength of 6 MPa or more. As a result, when the slurry of the heat-conductive resin composition is prepared, it is possible to further suppress an increase in the viscosity of the slurry of the heat-conductive resin composition due to a part of the second inorganic filler being peeled off from the second inorganic filler, and it is possible to further suppress an adhesion of a part of the second inorganic filler to the carrier film. The massive boron nitride particles of the second inorganic filler can be produced by the same method as that for the massive boron nitride particles of the first inorganic filler. In addition, by adjusting the particle diameter of the $B_4C$ which is the raw material of the massive boron nitride particles, the particle diameter at the second maximum point caused by the second inorganic filler can be set to be ⅔ or less of the particle diameter at the first maximum point.

The crushing strength of the second inorganic filler can be measured in accordance with JIS R1639-5. Specifically, the crushing strength of the second inorganic filler can be measured in the following manner. Components other than the inorganic filler component in the heat-conductive resin composition are dissolved out using solvents such as toluene, xylene, and chlorine-based hydrocarbons to remove the components other than the inorganic filler component from the heat-conductive resin composition. Then, the particle size distribution of the remaining inorganic filler component is measured using a laser diffraction scattering method particle size distribution measuring apparatus (LS-13 320) manufactured by Beckman Coulter, Inc. Next, after the inorganic filler component is sprayed on a sample table of a micro compression tester ("MCT-W500" manufactured by Shimadzu Corporation), the diameters of the inorganic filler component in the X direction and the Y direction are measured, and the average of the diameters is defined as the particle diameter of the inorganic filler component. Five inorganic filler components having a particle diameter within the range of the particle diameter at the second maximum point ±5 μm are selected and subjected to a compression test one by one. The crushing strength ($\sigma$: MPa) is calculated from the dimensionless number (a=2.48) which varies depending on the position in the particle, the crushing test force (P: N), and the particle diameter (d: μm) using the equation $\sigma = a \times P/(\Pi \times d^2)$. The crushing strengths of the five inorganic filler components are Weibull plotted in accordance with JIS R1625, and the crushing strength at which the cumulative fracture rate is 63.2% is defined as the crushing strength of the second inorganic filler.

In the particle size accumulation of the inorganic filler component, the integrated amount of the frequency of particle diameters of 0 to 15 μm is preferably less than 60%. Then, the content of the inorganic filler having particle diameters of 15 μm or more in the inorganic filler component is approximately 40% by volume or more, and the heat-conductive resin composition can contain the inorganic filler component at a high filling rate, and the thermal conductivity of the heat dissipation sheet produced using the heat-conductive resin composition can be further increased. From such a viewpoint, in the particle size accumulation of the inorganic filler component, the integrated amount of the frequency of particle diameters of 0 to 15 μm is more preferably less than 50%, still more preferably less than 40%, and even more preferably less than 30%.

(Resin Component)

Examples of resin of the resin component include epoxy resin, silicone resin (including silicone rubber), acrylic resin, phenol resin, melamine resin, urea resin, unsaturated polyester, fluororesin, polyamide (e.g., polyimide, polyamideimide, polyetherimide), polyester (e.g., polybutylene terephthalate, polyethylene terephthalate), polyphenylene ether, polyphenylene sulfide, fully aromatic polyester, polysulfone, liquid crystal polymer, polyethersulfone, polycarbonate, maleimide-modified resin, ABS resin, AAS (acrylonitrile-acrylic rubber-styrene) resin, and AES (acrylonitrile-ethylene/propylene/diene rubber-styrene) resin. Among them, silicone resin is preferable from the viewpoints of heat resistance, flexibility, and adhesion to a heat sink or the like. The silicone resin is preferably cured by vulcanization with an organic peroxide. The viscosity of the heat-conductive resin composition at 25° C. is, for example, 100,000 cp or more from the viewpoint of improving the flexibility of the sheet-shaped molded body.

The content of the inorganic filler component in 100% by volume of the total of the inorganic filler component and the resin component is preferably 30 to 85% by volume, and more preferably 40 to 80% by volume. When the content of the inorganic filler component is 30% by volume or more, the thermal conductivity is improved, and sufficient heat dissipation performance is easily obtained. In addition, when the content of the inorganic filler component is 85% by volume or less, it is possible to reduce occurrence of voids at the time of molding, and it is possible to reduce deterioration of insulating property and mechanical strength. The content of the resin component in 100% by volume of the heat-conductive resin composition is preferably 15 to 70% by volume, and more preferably 20 to 60% by volume.

(Solvent)

In order to adjust the viscosity of the heat-conductive resin composition, the heat-conductive resin composition may further contain a solvent. The solvent is not particularly limited as long as it can dissolve the resin component and can be easily removed from the heat-conductive resin composition applied after the heat-conductive resin composition is applied. When the resin component is a silicone resin, examples of the solvent include toluene, xylene, and chlorine-based hydrocarbons. Among these solvents, toluene is preferable from the viewpoint of easy removal. The content of the solvent can be appropriately selected depending on the desired viscosity of the heat-conductive resin composition. The content of the solvent is, for example, 40 to 200 parts by mass with respect to 100 parts by mass of components of the heat-conductive resin composition other than the solvent.

The heat-conductive resin composition may contain components other than the inorganic filler component, the resin component, and the solvent. Examples of the other components include additives and impurities, and the content of the other components is preferably 5 parts by mass or less, more preferably 3 parts by mass or less, and still more preferably 1 part by mass or less with respect to 100 parts by mass of the total of the inorganic filler component and the resin component.

[Heat Dissipation Sheet]

The heat dissipation sheet of the present invention is obtained by molding the heat-conductive resin composition of the present invention. By using the heat-conductive resin composition of the present invention, a thin heat dissipation sheet can be easily produced by a doctor blade method. The thickness of the heat dissipation sheet of the present invention is preferably 0.35 mm or less. When the thickness of the heat dissipation sheet is 0.35 mm or less, it is possible to meet the demand for the thickness of the heat dissipation sheet accompanying the miniaturization of heat-generating electronic components. From such a viewpoint, the thickness of the heat dissipation sheet is more preferably 0.30 mm or less, still more preferably 0.25 μm or less, still more preferably 0.20 μm or less, still more preferably 0.15 mm or less, still more preferably 0.12 mm or less, and particularly preferably 0.10 mm or less.

The heat dissipation sheet preferably includes a base material having a thickness of 0.05 mm or less. As a result, the thickness of the heat dissipation sheet can be reduced, and damage to the heat dissipation sheet during handling of the heat dissipation sheet can be suppressed. The base material is not particularly limited as long as it can hold heat-conductive resin composition layer, has an appropriate strength, has a thickness of 0.05 mm or less, and has flexibility. Examples of the base material include paper, cloth, film, nonwoven fabric, and metal foil. Among these, cloth is preferable from the viewpoint that adhesiveness to the heat-conductive resin composition layer is good and inhibition of heat conduction of the heat-conductive resin composition by the base material can be suppressed by providing an opening portion, and glass cloth and polyamide-imide fiber cloth are more preferable from the viewpoint that the strength of the base material can be maintained to some extent even when the base material is made thin and the opening is made large, and glass cloth is further preferable. Further, from the viewpoint that the heat dissipation sheet can be made thin, the thickness of the base material is more preferably 0.03 mm or less. Further, from the viewpoint of the strength of the base material, the thickness of the base material is preferably 0.005 mm or more. When the base material is a glass cloth, the glass cloth may be subjected to a silane coupling treatment in order to suppress formation of gaps between the heat-conductive resin composition and the glass cloth.

The heat dissipation sheet can be produced by a doctor blade method. For example, the heat dissipation sheet can be produced as follows. Raw materials other than the solvent, such as an inorganic filler component and a resin component, are dispersed in a solvent to prepare a slurry heat-conductive resin composition. Hereinafter, the slurry heat-conductive resin composition may be simply referred to as "slurry". Since the massive boron nitride particles used as the first inorganic filler have a high crushing strength of 6 MPa, the hexagonal boron nitride primary particles are hardly peeled off from the massive boron nitride particles when the raw materials other than the solvent are dispersed in the solvent. As a result, an increase in the viscosity of the slurry can be suppressed when the raw materials other than the solvent of the heat-conductive resin composition are dispersed in the solvent. The viscosity of the slurry can also be reduced by increasing the amount of solvent. However, in this case, it is desirable to reduce the viscosity of the slurry without increasing the amount of the solvent, because the heat-conductive resin composition may foam when the heat-conductive resin composition is molded into a sheet shape, or additives such as a vulcanizing agent and a curing agent in the heat-conductive composition may lose their effect when the solvent is removed from the molded body molded into a sheet shape. In addition, since the average particle diameter of the massive boron nitride particles used as the first inorganic filler is as relatively large as 20 μm or more, it is possible to prevent the dispersed inorganic filler component from agglomerating and making the slurry non-uniform after the raw materials other than the solvent in the heat-conductive resin composition are dispersed in the solvent. When the average particle diameter of the inorganic filler is very small, the dispersed inorganic filler may agglomerate to make the slurry non-uniform.

The prepared slurry is supplied to a doctor blade apparatus. The doctor blade apparatus causes the slurry to flow out through the gap between the blade and the carrier film to mold the heat-conductive resin composition into a sheet shape. The thickness of the molded body can be accurately controlled by adjusting the distance between the blade and the carrier film and the moving speed of the carrier film. In addition, in order to more accurately control the pressure of the slurry and more accurately control the thickness of the molded body, a doctor blade apparatus having two blades may be used.

The slurry flowing out from the gap between the blade and the carrier film moves in the doctor blade apparatus together with the carrier film, and is dried and solidified during the movement to form a sheet-shaped molded body. The obtained sheet-shaped molded body is, for example, pressurized and heated to be cured to form a heat dissipation sheet. In addition, a release agent may be applied to the surface of the carrier film so that the heat dissipation sheet can be easily released from the carrier film. Examples of the release agent include a silicone-based release agent, an alkyl pendant-based release agent, and a condensation wax-based release agent.

When the heat dissipation sheet includes a base material, for example, the heat dissipation sheet is produced as follows. A laminate is obtained by sandwiching a base material between two sheet-shaped molded bodies with carrier films obtained by a doctor blade method. The layer structure of the laminate is carrier film/heat-conductive resin composition/base material/heat-conductive resin composition/carrier film. Then, the laminate is pressurized and heated, and the carrier film is peeled off to form a heat dissipation sheet. In this case as well, a release agent may be applied to the surface of the carrier film so that the heat dissipation sheet can be easily released from the carrier film.

The heat dissipation sheet can also be produced by calendering. However, when the sheet-shaped heat-conductive resin composition passes through the calendar rolls, a part of the massive boron nitride particles may be peeled off from the massive boron nitride particles in the heat-conductive resin composition. Therefore, the heat dissipation sheet is preferably produced by the doctor blade method.

EXAMPLES

Hereinafter, the present invention will be described in detail with reference to Examples and Comparative Examples. However, the present invention is not limited to the following examples.

The heat-conductive resin composition of Examples and Comparative Examples were evaluated as follows.
(Viscosity of Slurry)

The viscosity of the slurry used for preparing the heat dissipation sheets of Examples and Comparative Examples was measured at a rotation speed of 20 rpm after 30 seconds after standing by using a B-type viscometer.
(Particle Size Distribution)

Components other than the inorganic filler component in the heat-conductive resin composition were dissolved out using toluene to remove the components other than the inorganic filler component from the heat-conductive resin composition. The particle size distribution of the remaining inorganic filler component was measured using a laser diffraction scattering method particle size distribution measuring apparatus (LS-13 320) manufactured by Beckman Coulter, Inc. Then, from the obtained particle size distribution, the first maximum value, the second maximum value, and the integrated amount of the frequency between the peak start and the peak end in the peak having the first maximum point were determined.
(Crushing Strength)

Components other than the inorganic filler component in the heat-conductive resin composition were dissolved out using solvents such as toluene, xylene, and chlorine-based hydrocarbons to remove the components other than the inorganic filler component from the heat-conductive resin composition. Then, the particle size distribution of the remaining inorganic filler component was measured using a laser diffraction scattering method particle size distribution measuring apparatus (LS-13 320) manufactured by Beckman Coulter, Inc. Next, after the inorganic filler component was sprayed on a sample table of a micro compression tester ("MCT-W500" manufactured by Shimadzu Corporation), the diameters of the inorganic filler component in the X direction and the Y direction were measured, and the average of the diameters was defined as the particle diameter of the inorganic filler component. Five inorganic filler components having a particle diameter within the range of the particle diameter at the first maximum point ±5 μm were selected and subjected to a compression test one by one. The crushing strength (σ: MPa) was calculated from the dimensionless number (a=2.48) which varies depending on the position in the particle, the crushing test force (P: N), and the particle diameter (d: μm) using the equation $\sigma = a \times P/(\Pi \times d^2)$. The crushing strengths of the five inorganic filler components were Weibull plotted in accordance with JIS R1625, and the crushing strength at which the cumulative fracture rate was 63.2% was defined as the crushing strength of the first inorganic filler. The crushing strength of the second inorganic filler was also measured in a similar manner.

(Integrated Amount of Frequency of Particle Diameters of 0 to 15 μm)

Components other than the inorganic filler component in the heat-conductive resin composition were dissolved out using toluene to remove the components other than the inorganic filler component from the heat dissipation sheet. Then, the particle size accumulation of the remaining inorganic filler component was measured using a laser diffraction scattering method particle size distribution measuring apparatus (LS-13 320) manufactured by Beckman Coulter, Inc. Then, an integrated amount of the frequency of particle diameters of 0 to 15 μm was calculated from the obtained particle size accumulation.

The heat dissipation sheets of Examples and Comparative Examples were evaluated as follows.

(Thermal Resistance)

The thermal resistance of the heat dissipation sheet was measured by applying a load of 1 MPa in accordance with ASTM D5470.

(Relative Density)

The relative density was calculated by dividing the density of the heat dissipation sheet by the theoretical density by the Archimedes method.

Example 1

In Example 1, massive boron nitride particles were produced by boron carbide synthesis, a pressure nitriding step, and a decarburization crystallization step as described below.

(Boron Carbide Synthesis)

100 parts by mass of orthoboric acid (hereinafter referred to as boric acid) manufactured by Nippon Denko Co., Ltd. and 35 parts by mass of acetylene black (HS100) manufactured by Denka Company Limited were mixed using a Henschel mixer, filled in a graphite crucible, and heated in an arc furnace in an argon atmosphere at 2200° C. for 5 hours to synthesize boron carbide ($B_4C$). The synthesized boron carbide mass was pulverized in a ball mill for 1 hour, sieved to a particle diameter of 75 μm or less using a sieve net, further washed with a nitric acid aqueous solution to remove impurities such as iron, and then filtered and dried to prepare a boron carbide powder having an average particle diameter of 20 μm. The carbon content of the obtained boron carbide powder was 20.0%.

(Pressure Nitriding Step)

The synthesized boron carbide was filled in a boron nitride crucible, and then heated for 10 hours under conditions of 2000° C. and 9 atm (0.8 MPa) in a nitrogen gas atmosphere using a resistance heating furnace to obtain boron carbonitride ($B_4CN_4$).

(Decarburization Crystallization Step)

100 parts by mass of the synthesized boron carbonitride and 90 parts by mass of boric acid were mixed using a Henschel mixer, filled in a boron nitride crucible, heated in a nitrogen gas atmosphere at a temperature raising rate from room temperature to 1000° C. at a rate of 10° C./min and from 1000° C. at a rate of 2° C./min using a resistance heating furnace under a pressure condition of 0.2 MPa, and heated at a firing temperature of 2020° C. and a holding time of 10 hours, thereby synthesizing massive boron nitride particles in which primary particles were agglomerated to form massive particles. The synthesized massive boron nitride particles were crushed by a Henschel mixer for 15 minutes, and then classified by a nylon sieve having a sieve mesh of 150 μm using a sieve net. The fired product was crushed and classified to obtain massive boron nitride particles 1 in which primary particles were agglomerated to form massive particles.

The average particle diameter (D50) of the obtained massive boron nitride particles 1 measured by a laser scattering method was 40 μm. In addition, the crushing strength of the massive boron nitride particles 1 was 12 MPa.

(Preparation of Heat Dissipation Sheet)

With respect to a total of 100% by volume of the obtained massive boron nitride particles 1, agglomerated boron nitride particles (trade name "SGPS" manufactured by Denka Company Limited, average particle diameter: 20 μm, crushing strength: 1.5 MPa), scale-like boron nitride particles (trade name "SP-3-7" manufactured by Denka Company Limited, average particle diameter: 3 μm), and liquid silicone resin 1 (methyl vinyl polysiloxane, trade name "CF-3110" manufactured by Dow Toray Industries, Inc.), 45% by volume of massive boron nitride particles 1, 12% by volume of agglomerated boron nitride particles, 3% by volume of scale-like boron nitride particles, and 40% by volume of silicone resin 1; 1 part by mass of a curing agent (2,5-dimethyl-2,5-bis(t-butyl peroxy)hexane, trade name "Trigonox 101" manufactured by Kayaku Nouryon Corporation) with respect to 100 parts by mass of the silicone resin; 0.5% by mass of a silane coupling agent (dimethyldimethoxysilane, trade name "DOWSIL Z-6329 Silane" manufactured by Dow Toray Industries, Inc., viscosity at 25° C.: 1 cp) with respect to 100 parts by mass of the total of the massive boron nitride particles, agglomerated boron nitride particles, and scale-like boron nitride particles; 15 parts by mass of water with respect to 100 parts by mass of the silane coupling agent; and 110 parts by mass of toluene with respect to 100 parts by mass of the total of the above-mentioned raw materials were put into a stirrer (trade name "Three-One Motor" manufactured by HEIDON Inc.) and mixed for 15 hours using a turbine type stirring blade to prepare a slurry of heat-conductive resin composition. The viscosity of the slurry was 10000 cp.

Then, the slurry was applied to a PET film (carrier film) having a thickness of 0.05 mm to a thickness of 0.2 mm by a doctor blade method, and dried at 75° C. for 5 minutes to produce a sheet-shaped molded body with a PET film. A glass cloth (thickness: 0.025 mm) was sandwiched between the sheet-shaped molded bodies with the PET film so that the coated surface of the heat-conductive resin composition was in contact with both sides of the glass cloth, thereby producing a laminate. The layer structure of the laminate was PET film/heat-conductive resin composition/glass cloth/heat-conductive resin composition/PET film. Next, the obtained laminate was heat-pressed for 25 minutes under the conditions of a temperature of 150° C. and a pressure of 160 kg/cm², and the PET films on both sides were peeled off to obtain a sheet having a thickness of 0.09 mm. Next, the sheet was subjected to secondary heating at 150° C. under normal pressure for 4 hours to obtain a heat dissipation sheet of Example 1.

Example 2

A heat dissipation sheet of Example 2 was prepared in the same manner as in Example 1, except that the blending amount of toluene was changed from 110 parts by mass to 60 parts by mass and the coating conditions of the doctor blade method were changed to prepare a heat dissipation sheet having a thickness of 0.20 mm. The viscosity of a slurry was 7000 cp.

Example 3

A heat dissipation sheet of Example 3 was prepared in the same manner as in Example 1, except that the blending amount of toluene was changed from 110 parts by mass to 50 parts by mass and the coating conditions of the doctor blade method were changed to prepare a heat dissipation sheet having a thickness of 0.31 mm. The viscosity of a slurry was 8000 cp.

Example 4

A heat dissipation sheet of Example 4 was prepared in the same manner as in Example 1 except that: instead of blending 45% by volume of the massive boron nitride particles 1 having an average particle diameter of 40 μm and a crushing strength of 12 MPa, 42% by volume of massive boron nitride particles 2 having an average particle diameter of 75 μm and a crushing strength of 12 MPa was blended; instead of blending 12% by volume of the agglomerated boron nitride particles, 11% by volume of massive boron nitride particles 3 having an average particle diameter of 38 μm and a crushing strength of 12 MPa was blended; the scale-like boron nitride particles were not mixed; the blending amount of the silicone resin 1 was changed from 40% by volume to 47% by volume; the blending amount of toluene was changed from 110 parts by mass to 100 parts by mass; and a heat dissipation sheet having a thickness of 0.10 mm was prepared by changing the coating conditions of the doctor blade method. The massive boron nitride particles 2 and 3 used for the heat dissipation sheet of Example 4 were produced in the same manner as the massive boron nitride particles 1 used for the heat dissipation sheet of Example 1 except that the average particle diameter of the boron carbide powder was changed by changing the grinding time of the synthesized boron carbide mass by the ball mill. The viscosity of a slurry was 10000 cp.

Example 5

A heat dissipation sheet of Example 5 was prepared in the same manner as in Example 4, except that the coating conditions of the doctor blade method were changed to prepare a heat dissipation sheet having a thickness of 0.20 mm.

Example 6

A heat dissipation sheet of Example 6 was prepared in the same manner as in Example 4, except that the coating conditions of the doctor blade method were changed to prepare a heat dissipation sheet having a thickness of 0.27 mm.

Example 7

A heat dissipation sheet of Example 7 was prepared in the same manner as in Example 1 except that massive boron nitride particles 4 having an average particle diameter of 55 μm and a crushing strength of 10 MPa were blended in place of the massive boron nitride particles 2, and a heat dissipation sheet having a thickness of 0.10 mm was prepared by changing the coating conditions of the doctor blade method. The massive boron nitride particles 4 used for the heat dissipation sheet of Example 7 were produced in the same manner as the massive boron nitride particles 1 used for the heat dissipation sheet of Example 1 except that the average particle diameter of the boron carbide powder was changed by changing the grinding time of the synthesized boron carbide mass by the ball mill. The viscosity of a slurry was 9500 cp.

Example 8

A heat dissipation sheet of Example 8 was prepared in the same manner as in Example 7, except that the coating conditions of the doctor blade method were changed to prepare a heat dissipation sheet having a thickness of 0.20 mm.

Example 9

A heat dissipation sheet of Example 9 was prepared in the same manner as in Example 7, except that the coating conditions of the doctor blade method were changed to prepare a heat dissipation sheet having a thickness of 0.28 mm.

Comparative Example 1

A heat dissipation sheet of Comparative Example 1 was prepared in the same manner as in Example 1, except that the massive boron nitride particles 1 and the scale-like boron nitride particles were not blended, the blending amount of the agglomerated boron nitride particles was changed from 12% by volume to 60% by volume, the blending amount of the silane coupling agent was changed from 0.5 parts by mass to 0.2 parts by mass, and a heat dissipation sheet having a thickness of 0.20 mm was prepared by changing the coating conditions of the doctor blade method. The viscosity of a slurry was 12000 cp. Further, since the viscosity of the slurry was high, it was impossible to prepare a heat dissipation sheet having a thickness of 0.15 mm or less.

Comparative Example 2

A heat dissipation sheet of Comparative Example 2 was prepared in the same manner as in Comparative Example 1, except that the coating conditions of the doctor blade method were changed to prepare a heat dissipation sheet having a thickness of 0.30 mm.

Comparative Example 3

A slurry was prepared in the same manner as in Example 7 except that the massive boron nitride particles 3 were changed to the massive boron nitride particles 1. However, since the viscosity of the slurry was as high as 16000 cp, it was impossible to prepare a heat dissipation sheet having a thickness of 0.20 mm.

Comparative Example 4

A slurry was prepared in the same manner as in Example 1 except that the blending amount of the massive boron nitride particles 1 was changed from 45% by volume to 12% by volume and the blending amount of the agglomerated boron nitride particles was changed from 12% by volume to 45% by volume. However, since the viscosity of the slurry was as high as 18000 cp, it was impossible to prepare a heat dissipation sheet having a thickness of 0.20 mm.

The evaluation results of the heat dissipation sheets of Examples 1 to 9 and Comparative Examples 1 to 4 are shown in Table 1.

TABLE 1

| | | | | Example 1 | Example 2 | Example 3 | Example 4 | Example 5 | Example 6 | Example 7 |
|---|---|---|---|---|---|---|---|---|---|---|
| Blend proportion | Inorganic filler component | Massive boron nitride particle 1 | % by volume | 45 | 45 | 45 | — | — | — | — |
| | | Massive boron nitride particle 2 | | — | — | — | 42 | 42 | 42 | — |
| | | Massive boron nitride particle 3 | | — | — | — | 11 | 11 | 11 | 11 |
| | | Massive boron nitride particle 4 | | — | — | — | — | — | — | 42 |
| | | Agglomerated boron nitride particle | | 12 | 12 | 12 | — | — | — | — |
| | | Scale-like boron nitride particle | | 3 | 3 | 3 | — | — | — | — |
| | Resin component | Silicone resin 1 | | 40 | 40 | 40 | 47 | 47 | 47 | 47 |
| | | Silicone resin 2 | | — | — | — | — | — | — | — |
| | Curing agent*1 | | part by mass | 1 | 1 | 1 | 1 | 1 | 1 | 1 |
| | Silane coupling agent*2 | | | 0.5 | 0.5 | 0.5 | 0.5 | 0.5 | 0.5 | 0.5 |
| | Water*3 | | | 15 | 15 | 15 | 15 | 15 | 15 | 15 |
| | Toluene*4 | | | 110 | 60 | 50 | 100 | 100 | 100 | 100 |
| Evaluation of Inorganic filler component | Particle diameter of First maximum value | | μm | 40 | 40 | 40 | 75 | 75 | 75 | 55 |
| | Crushing strength of First inorganic filler | | MPa | 12 | 12 | 12 | 12 | 12 | 12 | 10 |
| | Integrated amount of frequency of peak having First maximum point | | % | 75 | 75 | 75 | 79 | 79 | 79 | 79 |
| | Particle diameter at Second maximum point | | μm | 20 | 20 | 20 | 35 | 35 | 35 | 35 |
| | Crushing strength of Second inorganic filler | | MPa | 1.5 | 1.5 | 1.5 | 12 | 12 | 12 | 12 |
| Evaluation of Slurry | Viscosity of Slurry | | cp | 10000 | 7000 | 8000 | 10000 | 10000 | 10000 | 9500 |
| | Thickness of Glass cloth | | mm | 0.025 | 0.025 | 0.025 | 0.025 | 0.025 | 0.025 | 0.025 |
| Evaluation of Heat dissipation sheet | Thickness | | mm | 0.09 | 0.20 | 0.31 | 0.10 | 0.20 | 0.27 | 0.10 |
| | Integrated amount of frequency of particle diameter of 0 to 15 μm | | % | 20 | 17 | 16 | 8 | 7 | 7 | 9 |
| | Thermal resistance | | K/W | 0.45 | 0.51 | 0.68 | 0.42 | 0.60 | 0.65 | 0.36 |
| | Relative density | | % | 91 | 90 | 88 | 97 | 94 | 92 | 93 |

| | | | | Example 8 | Example 9 | Comparative Example 1 | Comparative Example 2 | Comparative Example 3 | Comparative Example 4 |
|---|---|---|---|---|---|---|---|---|---|
| Blend proportion | Inorganic filler component | Massive boron nitride particle 1 | % by volume | — | — | — | — | 1.1 | 12 |
| | | Massive boron nitride particle 2 | | — | — | — | — | — | — |
| | | Massive boron nitride particle 3 | | 11 | 11 | — | — | — | — |
| | | Massive boron nitride particle 4 | | 42 | 42 | — | — | 42 | — |
| | | Agglomerated boron nitride particle | | — | — | 60 | 60 | — | 45 |
| | | Scale-like boron nitride particle | | — | — | — | — | — | 3 |
| | Resin component | Silicone resin 1 | | 47 | 47 | 40 | 40 | 47 | 40 |
| | | Silicone resin 2 | | — | — | — | — | — | — |
| | Curing agent*1 | | part by mass | 1 | 1 | 1 | 1 | 1 | 1 |
| | Silane coupling agent*2 | | | 0.5 | 0.5 | 0.2 | 0.2 | 0.2 | 0.5 |
| | Water*3 | | | 15 | 15 | 15 | 15 | 15 | 15 |
| | Toluene*4 | | | 100 | 100 | 100 | 100 | 100 | 110 |

TABLE 1-continued

| | | | | | | | | |
|---|---|---|---|---|---|---|---|---|
| Evaluation of Inorganic filler component | Particle diameter of First maximum value | μm | 55 | 55 | 20 | 20 | 55 | 40 |
| | Crushing strength of First inorganic filler | MPa | 10 | 10 | 1.5 | 1.5 | 7 | 12 |
| | Integrated amount of frequency of peak having First maximum point | % | 79 | 79 | 100 | 100 | 79 | 20 |
| | Particle diameter at Second maximum point | μm | 35 | 35 | — | — | 40 | 20 |
| | Crushing strength of Second inorganic filler | MPa | 12 | 12 | — | — | 12 | 1.5 |
| Evaluation of Slurry | Viscosity of Slurry | cp | 9500 | 9500 | 12000 | 12000 | 16000 | 18000 |
| | Thickness of Glass cloth | mm | 0.025 | 0.025 | 0.05 | 0.05 | *5 | *5 |
| Evaluation of Heat dissipation sheet | Thickness | mm | 0.20 | 0.28 | 0.20 | 0.30 | | |
| | Integrated amount of frequency of particle diameter of 0 to 15 μm | % | 10 | 8 | 76 | 82 | | |
| | Thermal resistance | K/W | 0.48 | 0.55 | 1.0 | 1.2 | | |
| | Relative density | % | 94 | 92 | 90 | 90 | | |

*1Blending amount with respect to 100 parts by mass of silicone resin
*2Blending amount with respect to 100 parts by mass of the total of massive boron nitride particles, agglomerated boron nitride particles, and scale-like boron nitride particles
*3Blending amount with respect to 100 parts by mass of silane coupling agent
*4Blending amount with respect to 100 parts by mass of the total of raw materials other than toluene
*5: The heat dissipation sheet of 0.20 mm thick could not be properly formed.

From the above evaluation results, it was found that the viscosities of the slurries used for preparing the heat dissipation sheets of Examples 1 to 9 were lower than the viscosities of the slurries used for preparing the heat dissipation sheets of Comparative Examples 1 to 4. As a result, it was found that the slurries used for preparing the heat dissipation sheets of Examples 1 to 9 can prepare thin sheets as compared with the slurries used for preparing the heat dissipation sheets of Comparative Examples 1 to 4. In addition, it was found that the thermal resistance of the heat dissipation sheets of Examples 1 to 9 was lower than the thermal resistance of the heat dissipation sheets of Comparative Examples 1 and 2. This is considered to be because, in the heat dissipation sheets of Examples 1 to 9, when the PET film was peeled off from the sheet-shaped molded body, the boron nitride particles were not attached to the peeled PET film, and thus the surface of the heat dissipation sheet was smooth. On the other hand, in the heat dissipation sheets of Comparative Examples 1 and 2, when the PET film was peeled off from the sheet-shaped molded body, boron nitride particles were attached to the peeled PET film, so that the surface of the heat dissipation sheet became rough, and thus, it is considered that the thermal resistance of the heat dissipation sheets of Comparative Examples 1 and 2 was increased.

Example 10

A heat dissipation sheet having a thickness of 0.2 mm was prepared in the same manner as in Example 5 except that the silicone resin CF3110 was changed to an epoxy resin (bisphenol type epoxy resin manufactured by Mitsubishi Chemical Corporation, model number: JER-807), the curing agent Trigonox 101 (1 part by mass) was changed to a curing agent MEH-8005 (manufactured by Meiwa Plastic Industries, Ltd., 10 parts by mass), and 2PHZ-PW (manufactured by Shikoku Chemicals Corporation, 1 part by mass) was added as a curing accelerator, and the thermal resistance was measured by the above-described method.

Comparative Example 5

A heat dissipation sheet having a thickness of 0.2 mm was prepared in the same manner as in Comparative Example 1 except that the silicone resin CF3110 was changed to an epoxy resin (bisphenol type epoxy resin manufactured by Mitsubishi Chemical Corporation, model number: JER-807), the curing agent Trigonox 101 (1 part by mass) was changed to a curing agent MEH-8005 (manufactured by Meiwa Plastic Industries, Ltd., 10 parts by mass), and 2PHZ-PW (manufactured by Shikoku Chemicals Corporation, 1 part by mass) was added as a curing accelerator, and the thermal resistance was measured by the above-described method.

When the thermal resistance of Example 10 and the thermal resistance of Comparative Example 5 were compared, the thermal resistance of Example 10 was lower and a favorable result was obtained. Therefore, the effect obtained by combining specific inorganic fillers can be obtained regardless of the type of the resin.

The invention claimed is:

1. A heat-conductive resin composition comprising an inorganic filler component and a resin component, wherein
    the inorganic filler component comprises a first inorganic filler and a second inorganic filler,
    a particle size distribution of the inorganic filler component has a first maximum point caused by the first inorganic filler and a second maximum point caused by the second inorganic filler,
    a particle diameter at the first maximum point is 15 μm or more,
    a particle diameter at the second maximum point is 30% or more and ⅔ or less of the particle diameter at the first maximum point,
    an integrated amount of frequency between a peak start and a peak end in a peak having the first maximum point is 70% or more,
    an integrated amount of frequency between a peak start and a peak end in a peak having the second maximum point is 25% or more, and
    the first inorganic filler is formed by agglomerating hexagonal boron nitride primary particles and has a crushing strength of 6 MPa or more.

2. The heat-conductive resin composition according to claim 1, wherein the second inorganic filler is boron nitride particles.

3. The heat-conductive resin composition according to claim 2, wherein the second inorganic filler is massive boron nitride particles formed by agglomerating hexagonal boron nitride primary particles and having a crushing strength of 6 MPa or more.

4. The heat-conductive resin composition according to claim 1, wherein in particle size accumulation of the inorganic filler component, an integrated amount of the frequency of particle diameters of 0 to 15 μm is less than 60%.

5. A heat dissipation sheet obtained by molding the heat conductive resin composition according to claim 1.

6. The heat dissipation sheet according to claim 5, having a thickness of 0.35 mm or less.

7. The heat dissipation sheet according to claim 5, further comprising a base material having a thickness of 0.05 mm or less.

* * * * *